(12) United States Patent
Liu et al.

(10) Patent No.: US 7,741,719 B2
(45) Date of Patent: Jun. 22, 2010

(54) INTEGRATED CIRCUIT SYSTEM WITH DUMMY REGION

(75) Inventors: Dong Sheng Liu, Singapore (SG); Cing Ge Lim, Singapore (SG); Subbiah Chettiar Mahadevan, Johor Bahru (MY); Feng Chen, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 102 days.

(21) Appl. No.: 12/235,784

(22) Filed: Sep. 23, 2008

(65) Prior Publication Data

US 2009/0014883 A1 Jan. 15, 2009

Related U.S. Application Data

(62) Division of application No. 11/307,142, filed on Jan. 25, 2006, now Pat. No. 7,446,039.

(51) Int. Cl.
*H01L 23/48* (2006.01)
(52) U.S. Cl. ...................................... 257/763

(58) Field of Classification Search ................. 257/763, 257/E23.01
See application file for complete search history.

(56) References Cited

U.S. PATENT DOCUMENTS

| 5,909,628 | A | 6/1999 | Chatterjee et al. |
| 5,916,855 | A | 6/1999 | Avanzino et al. |
| 6,093,631 | A | * | 7/2000 | Jaso et al. ................ 438/618 |
| 6,849,946 | B2 | 2/2005 | Sethuraman et al. |
| 2002/0106886 | A1 | 8/2002 | Sethuraman et al. |

* cited by examiner

*Primary Examiner*—Sue Purvis
*Assistant Examiner*—Krista Soderholm
(74) *Attorney, Agent, or Firm*—Mikio Ishimaru

(57) ABSTRACT

An integrated circuit system comprised by forming a first region, a second region and a third region within a dielectric over a substrate. The first region includes tungsten plugs. The second region is formed adjacent at least a portion of the perimeter of the first region and the third region is formed between the first region and the second region. An opening is formed in the third region and a material is deposited within the opening for preventing erosion of the first region.

10 Claims, 3 Drawing Sheets

US 7,741,719 B2

INTEGRATED CIRCUIT SYSTEM WITH DUMMY REGION

CROSS-REFERENCE TO RELATED APPLICATION(S)

This application is a Divisional of U.S. Non Provisional patent application Ser. No. 11/307,142 filed Jan. 25, 2006, and the subject matter thereof is hereby incorporated herein by reference thereto.

TECHNICAL FIELD

The present invention relates generally to integrated circuit technology, and more particularly to a system for reducing chemical mechanical polishing (CMP) overetch.

BACKGROUND ART

Integrated circuits (ICs) are what power today's electronic devices, such as, cellphones, calculators, televisions, portable computers, portable music players, etc. IC fabrication has progressed to the sub 0.25 micron design era, with tens of millions of transistors and an estimated 50 million connections on a few square centimeters of an ICs surface. This advanced level of IC fabrication involves many process steps that deposit or grow films, followed by repeated patterning to form device and interconnect structures.

Multiple level metallization is the enabling technology that permits interconnecting the millions of transistors and supporting components on individual ICs. Multiple level metallization promotes higher device density because of its efficient use of vertical space. Of course, interlayer dielectric layers (ILDs) are needed to electrically isolate these multiple metal layers. The ILDs are commonly photolithographically patterned and dry-etched to open vias for metal interconnection.

Multiple level metallization creates the need for billions of these vias. The vias are filled with metal to form electrical pathways between metal layers. The most commonly used metal for filling the vias is tungsten. Tungsten is a good plug material because of its resistance to electromigration. Tungsten is also a good plug material because of its ability to uniformly fill high-aspect ratio vias when deposited by chemical vapor deposition (CVD).

Tungsten CVD is typically deposited in blanket films. Blanket deposition deposits tungsten non-selectively on the entire wafer surface, including the via pathways. It is necessary to remove the excess blanket deposited tungsten because such excess will lead to a non-planar topography, which will adversely affect later processing steps.

Previous methods have employed a tungsten etchback process to remove the excess tungsten and leave a planarized plug. In the sub 0.25 micron device generation, planarization of tungsten by CMP is the preferred process. Unfortunately, CMP overetch at the boundary between tungsten arrays and dielectric spaces can be so severe as to cause serious recess at this region. Consequently, later deposited metal layers will be trapped within the recess during subsequent metal deposition steps. The trapped metal layers are very difficult to remove by subsequent processes (e.g.—metal-1 layer copper CMP) and can cause electrical shorts.

Thus, a need still remains for a reliable tungsten CMP process that will reduce the incidence of CMP overetch during tungsten polishing. In view of the ever increasing need to improve product yield, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system by forming a first, second and third region within a dielectric over a substrate. The first region includes tungsten plugs. The second region is formed adjacent at least a portion of the perimeter of the first region and the third region is formed between the first region and the second region. An opening is formed in the third region and a material is deposited within the opening for preventing erosion of the first region.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
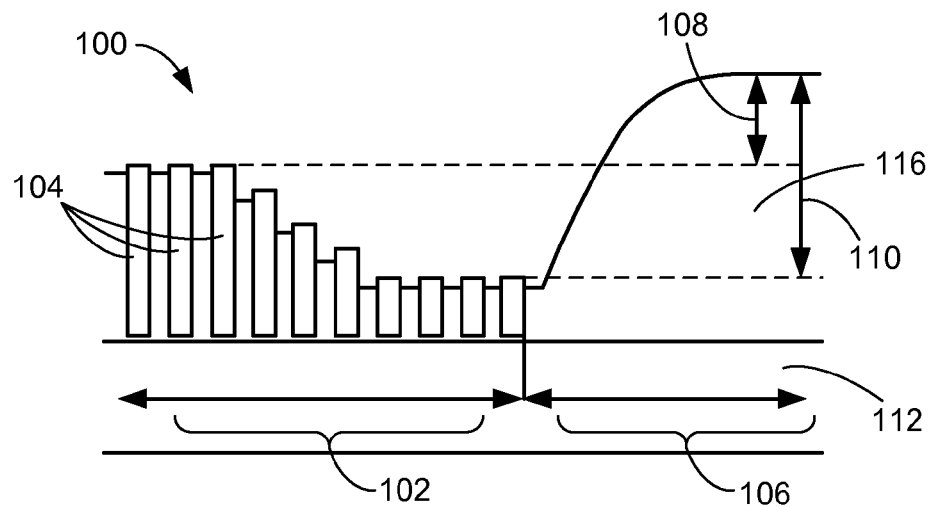
FIG. 1 (PRIOR ART) is a cross sectional view of a portion of a via sea exhibiting fang-shaped erosion.

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the invention are semi-diagrammatic and not to scale and, particularly, some of the dimensions are for the clarity of presentation and are shown exaggerated in the drawing FIGs. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the first region, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Referring now to FIG. 1 (PRIOR ART), therein is shown a cross sectional view of a portion of a via sea 100 exhibiting fang-shaped erosion. FIG. 1 (PRIOR ART) depicts a dense array 102, one or more tungsten filled vias 104, a region without vias 106, an erosion depression height 108, an overetch depression height 110, a substrate 112, and a dielectric 116. The dense array 102 commonly includes the one or more tungsten filled vias 104. The one or more tungsten filled vias 104 provide electrical connection between multi-level metallization layers (not shown).

The one or more tungsten filed vias 104 can be formed by first photolithographically patterning and dry-etching a dielectric 116 to form open vias. After via formation, a barrier layer is commonly deposited within the open vias to promote adhesion and prevent electromigration of the plug material. After deposition of the barrier layer, tungsten is normally blanket deposited by chemical vapor deposition (CVD) methods. CVD is the preferred deposition method for tungsten because it uniformly fills high aspect ratio features without high incidence of void formation. The vias are over-filled with tungsten to ensure complete fill.

CVD blanket deposition of tungsten forms tungsten over the entire exposed wafer surface. Consequently, excess tungsten deposited outside of the vias must be removed. Excess tungsten is commonly removed by CMP methods.

As FIG. 1 (PRIOR ART) depicts, despite careful slurry composition and pad stiffness selectivity, overetch occurs at the boundary between the dense array 102 and the region without vias 106. If the overetch at the boundary of dense array 102 and the region without vias 106 is severe enough, subsequently deposited metal layers can cause an electrical short.

Most notably, FIG. 1 (PRIOR ART) shows fang-shaped erosion/overetch at the boundary between the dense array 102 and the region without vias 106. The severity of the fang-shaped erosion is witnessed by the overetch depression height 110. The overetch depression height 110 is a measure of the difference between the dense array 102 height at the boundary with the region without vias 106 and the height of the region without vias 106. As the overetch depression height 110 gets larger, the more pronounced the fang-shaped erosion becomes and the greater the likelihood that subsequently deposited metal layers can cause an electrical short. FIG. 1 (PRIOR ART) also depicts the erosion depression height 108, which is a measure of the difference between the dense array 102 height and the height of the region without vias 106.

Figure 2:
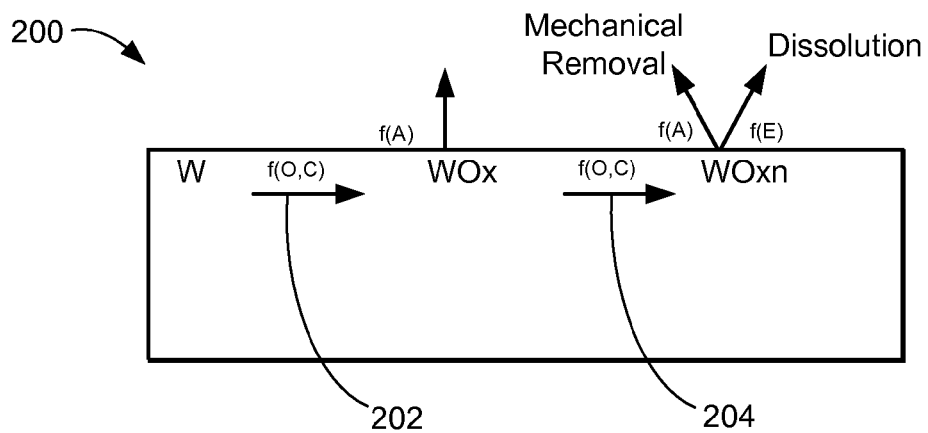
FIG. 2 is an illustration of a proposed mechanism for tungsten chemical mechanical polishing in accordance with an embodiment of the present invention.

Referring now to FIG. 2, therein is shown an illustration 200 of a proposed mechanism for tungsten chemical mechanical polishing in accordance with an embodiment of the present invention. The theory for metal CMP is not as well understood as oxide polish but illustration 200 presents one model explaining metal polishing using both a chemical oxidation and mechanical abrasion mechanism. The illustration 200 includes a chemical reaction step 202 and a mechanical removal step 204.

The chemical reaction step 202 and the mechanical removal step 204 are reaction steps dependent upon functions such as, oxidation, mechanical removal, and dissolution. The oxidation function f(O,C) is a function of the oxidizer (O) and the catalyst (C). The mechanical removal function f(A) is a function of the abrasive used and the down-force applied. The dissolution function f(E) is a function of the etchant employed.

The chemical reaction step 202, dependent upon f(O,C) and f(A), introduces a tungsten metal slurry that oxidizes the tungsten upon contact. By way of example, and not by way of limitation, a common tungsten metal slurry is a mixture of hydrogen peroxide ($H_2O_2$) and silica. The $H_2O_2$ decomposes into $H_2O$ and dissolved $O_2$ during polishing. The $O_2$ reacts with the tungsten and converts the tungsten into tungsten oxide ($WO_x$). The tungsten oxide is softer than tungsten, and is therefore more easily removed during the mechanical removal step 204.

After the chemical reaction step 202, the tungsten oxide is removed by the mechanical removal step 204, which is dependent upon f(O,C), f(A), and f(E). The mechanical abrasion from the polishing pad and the particles within the slurry act together to remove the oxide layer. Once the tungsten oxide layer is removed, the chemicals in the slurry oxidize the newly exposed metal surface and the process repeats itself. The symbols $WO_{xn}$ represent the additional tungsten oxidation of the newly exposed metal surface as the process repeats itself. After this primary removal step is completed, a secondary polish or buff step is employed using deionized water to remove microscratches and particles that remain on the wafer surface.

Figure 3:
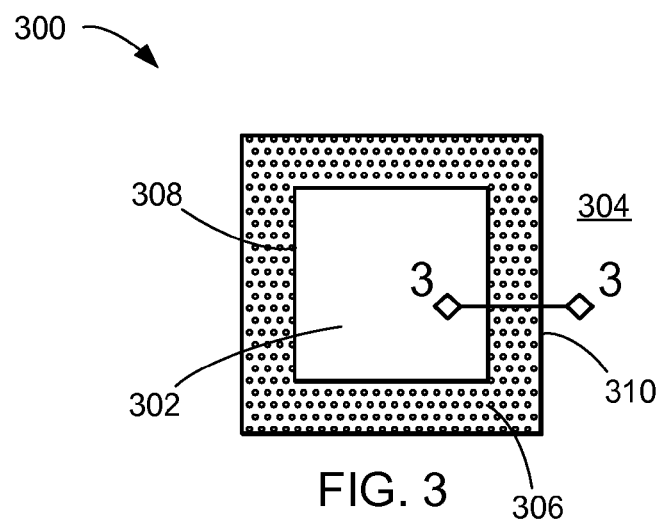
FIG. 3 is a top plan view of an integrated circuit system in accordance with an embodiment of the present invention.

Referring now to FIG. 3, therein is shown a top plan view of an integrated circuit system (300) in accordance with an embodiment of the present invention. The integrated circuit system 300 includes a first region 302, a second region 304 and a third region 306 formed in the dielectric 116 of FIG. 1. For example, and not by way of limitation, the first region 302 can be a dense array of plugs, the second region 304 can be a dielectric, for example, silicon dioxide, and the third region 306 can be a dummy region of plugs. Furthermore, by way of example and not by way of limitation, the dense array of plugs in the first region 302 and the dummy region of plugs in the third region 306 can be tungsten filled plugs.

In accordance with an embodiment of the present invention, FIG. 3 depicts the second region 304 completely surrounding, and set off from the perimeter of the first region 302, by the third region 306. Otherwise stated, the third region 306 is formed between the first region 302 and the second region 304. Although FIG. 3 depicts the second region 304 completely surrounding the first region 302, the second region 304 can be formed so as to be adjacent only a portion of the perimeter of the first region 302. For example, if the first region 302 is square in shape, then the second region may be formed on only one side, and, correspondingly, the third region would be formed only in the region between the first region 302 and the second region 304.

As stated above, the third region 306 can be a dummy region of plugs. The location and the amount of plugs within the third region 306 helps to protect the first region 302. The location of the third region 306 helps to protect the first region 302 by being formed in the region that experiences the most severe erosive forces (i.e.—the region between the outer perimeter of the first region 308 and the inner perimeter of the second region 310). As depicted by FIG. 1 (PRIOR ART), the outer perimeter of the dense array 102, adjacent the region without vias 106, experiences the most erosion; therefore, by placing the dummy region of plugs (i.e.—the third region 306) adjacent the second region 304, the dummy region of plugs experiences the most severe erosive stresses and the first region 302 remains unharmed.

Figure 4:
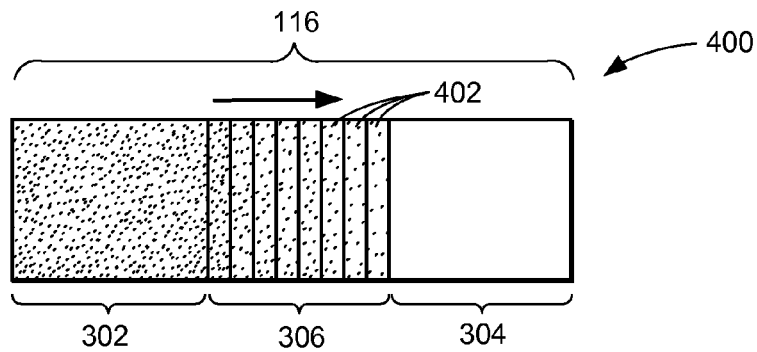
FIG. 4 is a top plan view of the structure of FIG. 3 taken on line 3-3.

Furthermore, as mentioned above, the amount of plugs within the third region 306 also helps to prevent erosive stresses upon the first region 302. Succinctly stated, as the amount of plugs within the third region 306 is reduced, the magnitude of erosion caused by the CMP process is also reduced. This concept is elucidated more by FIG. 4. FIG. 4 is an exploded view of line 3-3 of FIG. 3.

Referring now to FIG. 4, therein is shown a top plan view of the structure of FIG. 3 taken on line 3-3 in accordance with an embodiment of the present invention. FIG. 4 illustrates how the third region 306 is located between and contiguous with the first region 302 and the second region 304. Furthermore, FIG. 4 illustrates an embodiment of the present invention wherein the third region 306 forms dummy rings 402, with varying amounts of tungsten plugs, formed around the first region 302. The amount of the tungsten plugs within the dummy rings 402 is decreased from the first region 302 to the second region 304. This concept is elucidated by the number of darkened circles within each of the dummy rings 402, wherein the darkened circles are representative of the amount of tungsten plugs within each of the dummy rings 402.

Additionally, instead of forming discrete tungsten plugs, continuous tungsten filled trenches that consume less dielectric space can be formed so as to vary the amount of tungsten within each of the dummy rings 402. It is to be understood that the feature formation of plugs or trenches is not essential, what is important is that the amount of tungsten within the third region 306 decreases from the first region 302 to the second region 304, regardless of feature formation.

Correspondingly, as the amount of tungsten plugs decreases, then the amount of the dielectric 116 material increases. Stated otherwise, the amount of the dielectric 116 material decreases from the second region 304 the first region 302. The import of this concept lies in the fact that tungsten is a softer material to polish than the dielectric 116 material chosen. Since the dielectric 116 polishes at a slower rate than the tungsten, the boundary region between the third region 306 and the second region 304 experiences reduced erosion during polishing. By preventing erosion and overetch at the boundary, the possibility of an electrical short caused by subsequently deposited metal layers is prevented.

Figure 5:
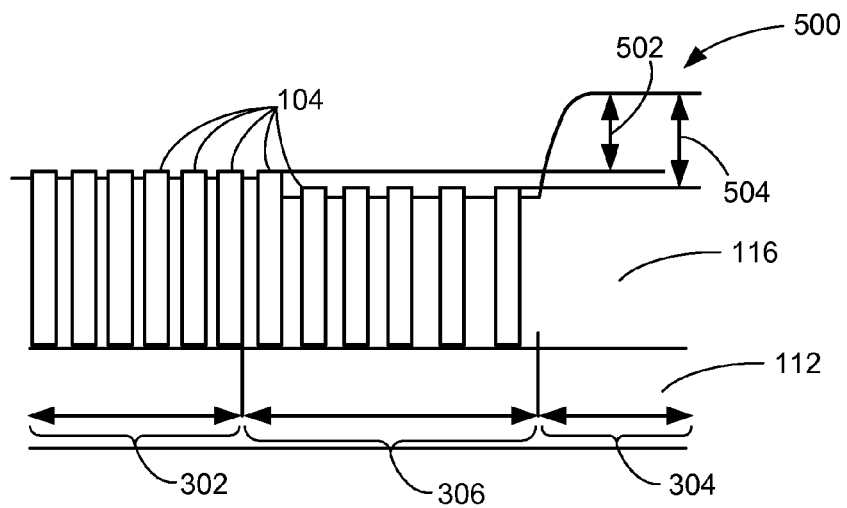
FIG. 5 is a cross sectional view of a portion of a via sea employing a dummy region in accordance with an embodiment of the present invention.

Referring now to FIG. 5, therein is shown a cross sectional view of a portion of a via sea 500 employing a dummy region. Illustration 500 depicts the one or more tungsten filled vias 104, the substrate 112, the dielectric 116, the first region 302, the second region 304, the third region 306, an erosion depression height with dummy region 502, and an overetch depression height with dummy region 504.

The illustration 500 depicts a dielectric 116 including the first region 302, the second region 304, and the third region 306 formed over a substrate 112. The dielectric 116 can be an oxide, a nitride, an alloy thereof, a compound thereof, and a combination thereof. The first region 302 is formed by processing the dielectric 116 to form a plug region with one or more vias filled with a conducting material. By way of example and not by way of limitation, the conducting material used to fill the one or more vias can be tungsten.

The third region 306 is formed by processing the dielectric 116 to form a dummy region along at least one boundary of the first region 302 and along at least one boundary of the second region 304. The third region 306 is further processed by forming, configuring, and filling one or more openings to reduce overetech at the boundary between the third region 306 and the second region 304. The one or more openings within the third region 306 can either be discrete or continuous. By way of example and not by way of limitation, the one or more openings within the third region 306 can also be filled with tungsten.

Most notably, FIG. 5 demonstrates that the erosion depression height with dummy region 502 and the overetch depression height with dummy region 504 are significantly reduced over that of the erosion depression height 108 and the overetch depression height 110, of FIG. 1.

By forming the third region 306 between the first region 302 and the second region 304, the amount of erosion and overetch experienced by the first region 302 is greatly reduced. More importantly, the amount of erosion and overetch experienced by the first region 302 is almost eliminated. By forming the third region 306 in the region that experiences the majority of erosion and overetch stresses, the tungsten plug array formed within the first region can be protected. Since the first region is protected, the incidence of electrical short occurring from subsequent metal layer deposition is almost eliminated.

Figure 6:
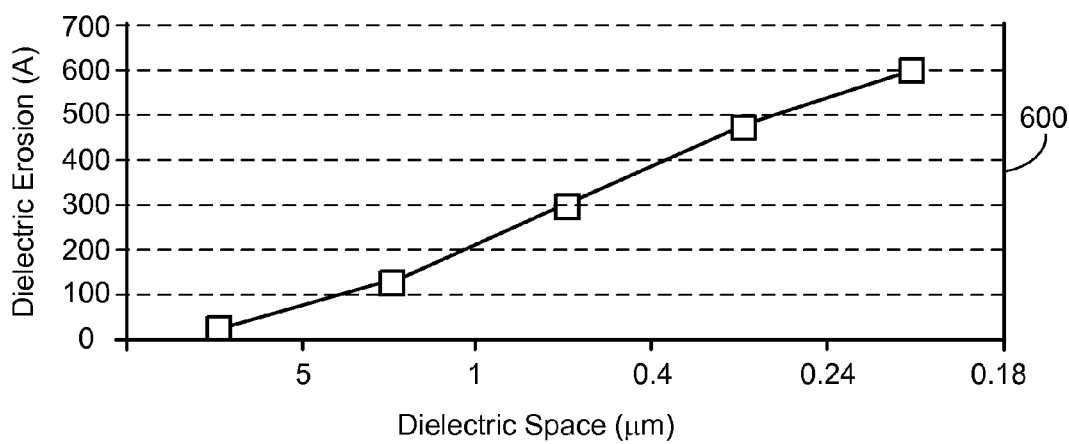
FIG. 6 is a graph of dielectric erosion as a function of dielectric space in accordance with an embodiment of the present invention.

Referring now to FIG. 6, therein is shown, a graph 600 of dielectric erosion as a function of dielectric space in accordance with an embodiment of the present invention. Graph 600 illustrates how erosion decreases as the amount of dielectric space increases. The inverse relationship between dielectric erosion and dielectric space occurs because as the dielectric space decreases, the amount of tungsten increases; since tungsten is a softer material than the chosen dielectric, the amount of erosion increases. Conversely, if the dielectric space increases, the amount of tungsten decreases, and the amount of dielectric erosion decreases because the chosen dielectric is harder than tungsten. Graph 600 demonstrates how varying the tungsten density within the third region 306 can affect erosion rates experienced across the region and consequently control erosion of the first region 302 and overetch at the boundary of the second region 304 and the third region 306.

Figures 7, 8:
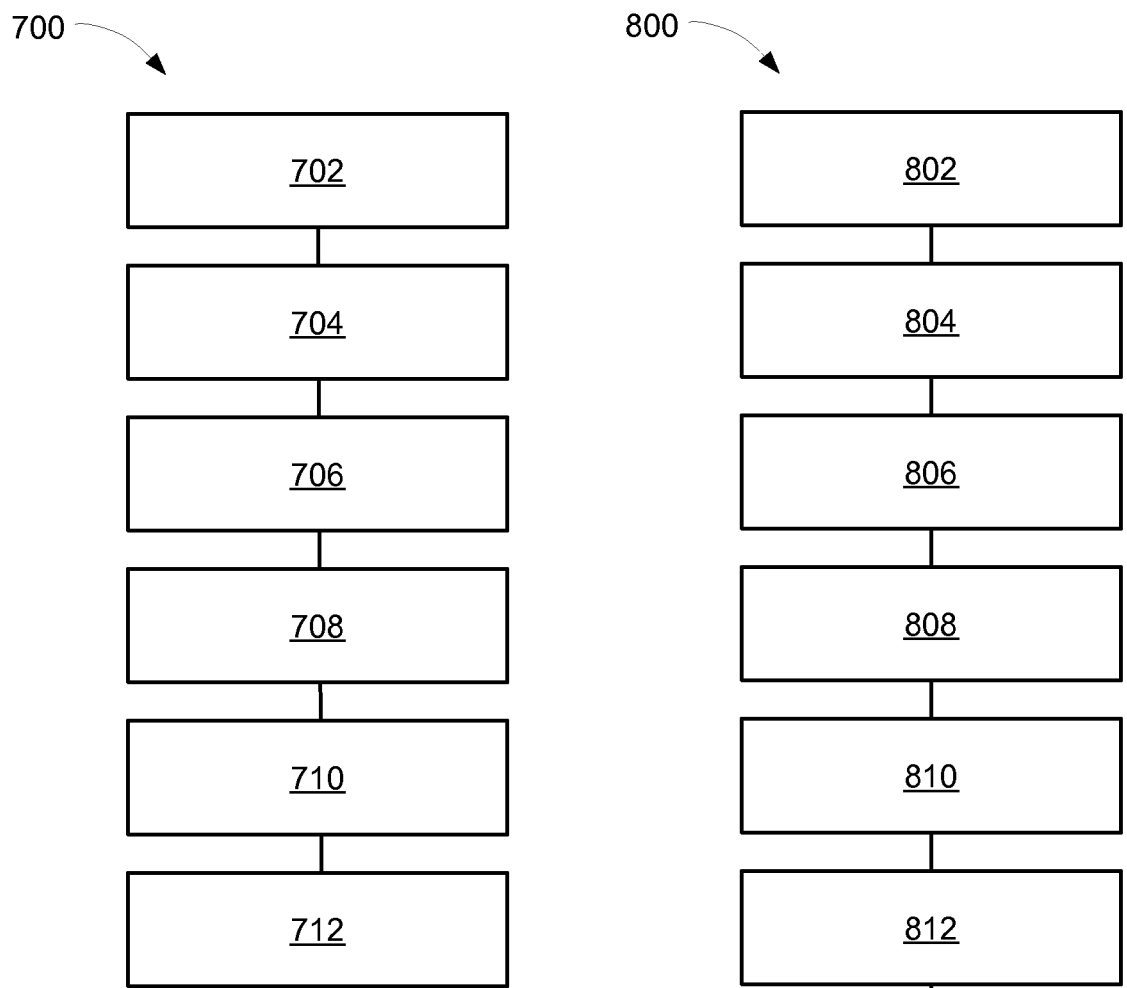
FIG. 7 is a flow chart for fabricating an integrated circuit system in accordance with an embodiment of the present invention.
FIG. 8 is a flow chart for fabricating an integrated circuit system in accordance with an embodiment of the present invention.

Referring now to FIG. 7, therein is shown a flow chart of an integrated circuit system 700 for fabricating an integrated circuit system in accordance with an embodiment of the present invention. The system 700 includes forming a substrate in a block 702; forming a first region with tungsten plugs over the substrate in a block 704; forming a second region over the substrate and adjacent a portion of the perimeter of the first region in a block 706; forming a third region over the substrate between the first region and the second region in a block 708; forming openings in the third region in a block 710; and depositing a material within the openings for reducing erosion of the first region in a block 712.

Referring now to FIG. 8, therein is shown a flow chart 800 for fabricating an integrated circuit system in accordance with an embodiment of the present invention. The flow chart 800 includes forming a substrate in a block 802; forming a dielectric layer over the substrate in a block 804; processing the dielectric layer to form a plug region in a block 806; processing the plug region to form one or more vias filled with tungsten in a block 808; processing the dielectric layer to form a dummy region along at least one boundary of the plug region and along at least one boundary of a dielectric space region in a block 810; processing the dummy region to form one or more openings in a block 812; filling the one or more openings with tungsten in a block 814; and configuring the one or more openings within the dummy region to reduce overetch at the boundary between the dummy region and the dielectric space region in a block 816.

It has been discovered that the present invention has a distinct advantage over commonly employed CMP techniques. The advantage is that overetch at the boundary of a tungsten plug array is greatly reduced by forming a dummy region system. By reducing overetch, the incidence of electrical short is almost eliminated and product yield is greatly increased. This and other valuable aspects of the present invention consequently further the state of the technology to at least the next level.

Thus, it has been discovered that the integrated circuit system of the present invention furnishes important and heretofore unknown and unavailable solutions, capabilities, and functional advantages. For instance, by forming a dummy region system to absorb erosion and overetch stresses, the amount of overetch can be reduced, as well as, the incidence of electrical short. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. An integrated circuit system comprising:
    a first region within a dielectric including a tungsten plug;
    a second region within the dielectric adjacent the entire boundary of the first region; and
    a third region within the dielectric formed between the first region and second region, wherein the third region contains openings filled with a material that prevents erosion of the first region.

2. The system as claimed in claim 1 wherein:
    the dielectric includes a substance selected from an oxide, a nitride, an alloy thereof, a compound thereof, and a combination thereof.

3. The system as claimed in claim 1 wherein:
    the material used to fill the openings includes a tungsten material.

4. The system as claimed in claim 1 wherein:
    the third region includes continuous or discrete openings within dummy rings.

5. The system as claimed in claim 1 further comprising:
    an amount of the openings configured to decrease from the first region to the second region.

6. An integrated circuit system comprising:
    a substrate;
    a dielectric formed over the substrate;
    a first region within the dielectric including tungsten plugs; and
    a third region within the dielectric adjacent the entire boundary of the first region and adjacent a boundary of a second region within the dielectric, wherein the third region contains openings configured to prevent overetch at the boundary between the third region and the second region.

7. The system as claimed in claim 6 wherein:
    the openings includes continuous or discrete openings.

8. The system as claimed in claim 6 wherein:
    the openings contain tungsten.

9. The system as claimed in claim 6 wherein:
    the third region is contiguous with the first region and the second region.

10. The system as claimed in claim 6 wherein:
    dummy rings within the third region include the openings configured to decrease from the first region to the second region.

* * * * *